United States Patent
Chung et al.

(10) Patent No.: US 7,265,048 B2
(45) Date of Patent: Sep. 4, 2007

(54) REDUCTION OF COPPER DEWETTING BY TRANSITION METAL DEPOSITION

(75) Inventors: Hua Chung, San Jose, CA (US); Seshadri Ganguli, Sunnyvale, CA (US); Christophe Marcadal, Sunnyvale, CA (US); Jick M. Yu, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 177 days.

(21) Appl. No.: 11/069,514

(22) Filed: Mar. 1, 2005

(65) Prior Publication Data

US 2006/0199372 A1   Sep. 7, 2006

(51) Int. Cl.
  *H01L 21/4763*   (2006.01)
(52) U.S. Cl. .............. 438/628; 438/628; 438/672; 257/E21.295; 257/E21.44; 427/126.5; 427/455
(58) Field of Classification Search ........... 438/628, 438/672; 257/E21.295, E21.44; 427/126.5, 427/455
See application file for complete search history.

(56) References Cited

U.S. PATENT DOCUMENTS

| | | |
|---|---|---|
| 4,316,942 A | 2/1982 | Kuo |
| 5,186,718 A | 2/1993 | Tepman et al. |
| 5,372,849 A | 12/1994 | McCormick et al. |
| 5,868,913 A | 2/1999 | Hodgson |
| 5,973,405 A | 10/1999 | Keukelaar et al. |
| 6,063,705 A | 5/2000 | Vaartstra |
| 6,074,945 A | 6/2000 | Vaartstra et al. |
| 6,114,557 A | 9/2000 | Uhlenbrock et al. |
| 6,156,382 A | 12/2000 | Rajagopalan et al. |
| 6,206,967 B1 | 3/2001 | Mak et al. |
| 6,274,484 B1 | 8/2001 | Tsai et al. |
| 6,306,776 B1 | 10/2001 | Srinivasan et al. |
| 6,338,991 B1 | 1/2002 | Zhang et al. |

(Continued)

FOREIGN PATENT DOCUMENTS

EP          1 293 509          9/2002

(Continued)

OTHER PUBLICATIONS

Aaltonen, et al., "Atomic Layer Deposition of Ruthenium from $RuCp_2$ and Oxygen: Film Growth and Reaction Mechanism Studies," Electrochemical Society Proceedings vol. 2003-08 pp. 946-953.

(Continued)

*Primary Examiner*—Matthew Smith
*Assistant Examiner*—Thanh Pham
(74) *Attorney, Agent, or Firm*—Patterson & Sheridan LLP

(57) ABSTRACT

A method and apparatus for forming layers on a substrate comprising depositing a metal seed layer on a substrate surface having apertures, depositing a transition metal layer over the copper seed layer, and depositing a bulk metal layer over the transition metal layer. Also a method and apparatus for forming a via through a dielectric to reveal metal at the base of the via, depositing a transition metal layer, and depositing a first metal layer on the transition metal layer. Additionally, a method and apparatus for depositing a transition metal layer on an exposed metal surface, and depositing a layer thereover selected from the group consisting of a capping layer and a low dielectric constant layer.

33 Claims, 7 Drawing Sheets

U.S. PATENT DOCUMENTS

| | | |
|---|---|---|
| 6,365,502 B1 | 4/2002 | Paranjpe et al. |
| 6,423,619 B1 | 7/2002 | Grant et al. |
| 6,440,495 B1 | 8/2002 | Wade et al. |
| 6,441,492 B1 | 8/2002 | Cunningham |
| 6,462,367 B2 | 10/2002 | Marsh et al. |
| 6,479,100 B2 | 11/2002 | Jin et al. |
| 6,482,736 B1 | 11/2002 | Basceri et al. |
| 6,482,740 B2 | 11/2002 | Soininen et al. |
| 6,517,616 B2 | 2/2003 | Marsh et al. |
| 6,527,855 B2 | 3/2003 | DelaRosa et al. |
| 6,541,067 B1 | 4/2003 | Marsh et al. |
| 6,576,778 B1 | 6/2003 | Uhlenbrock et al. |
| 6,580,111 B2 | 6/2003 | Kim et al. |
| 6,605,735 B2 | 8/2003 | Kawano et al. |
| 6,610,568 B2 | 8/2003 | Marsh et al. |
| 6,617,634 B2 | 9/2003 | Marsh et al. |
| 6,627,995 B2 | 9/2003 | Paranjpe et al. |
| 6,645,847 B2 | 11/2003 | Paranjpe et al. |
| 6,653,236 B2 | 11/2003 | Wai et al. |
| 6,680,251 B2 | 1/2004 | Won et al. |
| 6,692,795 B2 | 2/2004 | Won et al. |
| 6,713,373 B1 * | 3/2004 | Omstead .................. 438/608 |
| 6,737,317 B2 | 5/2004 | Marsh et al. |
| 6,743,739 B2 | 6/2004 | Shimamoto et al. |
| 6,744,138 B2 | 6/2004 | Marsh |
| 6,764,943 B2 | 7/2004 | Basceri et al. |
| 6,780,758 B1 | 8/2004 | Derderian et al. |
| 6,787,912 B2 | 9/2004 | Lane et al. |
| 6,790,773 B1 | 9/2004 | Drewery et al. |
| 6,800,542 B2 | 10/2004 | Kim |
| 6,800,937 B2 | 10/2004 | Marsh et al. |
| 6,812,112 B2 | 11/2004 | Basceri et al. |
| 6,824,816 B2 * | 11/2004 | Aaltonen et al. ........... 427/124 |
| 6,887,795 B2 | 5/2005 | Soininen et al. |
| 6,893,915 B2 | 5/2005 | Park et al. |
| 2001/0006838 A1 | 7/2001 | Won et al. |
| 2001/0054730 A1 | 12/2001 | Kim et al. |
| 2002/0000567 A1 | 1/2002 | Kim et al. |
| 2002/0004293 A1 | 1/2002 | Soininen et al. |
| 2002/0025627 A1 | 2/2002 | Marsh et al. |
| 2002/0028556 A1 | 3/2002 | Marsh et al. |
| 2002/0037609 A1 | 3/2002 | Zhang et al. |
| 2002/0074577 A1 | 6/2002 | Marsh et al. |
| 2002/0076881 A1 | 6/2002 | Marsh et al. |
| 2002/0081381 A1 | 6/2002 | Delarosa et al. |
| 2002/0102810 A1 | 8/2002 | Iizuka et al. |
| 2002/0121697 A1 | 9/2002 | Marsh |
| 2002/0125516 A1 | 9/2002 | Marsh et al. |
| 2002/0173054 A1 | 11/2002 | Kim |
| 2003/0042597 A1 | 3/2003 | Kusukawa et al. |
| 2003/0079686 A1 | 5/2003 | Chen et al. |
| 2003/0082307 A1 | 5/2003 | Chung et al. |
| 2003/0096468 A1 | 5/2003 | Soininen et al. |
| 2003/0165615 A1 | 9/2003 | Aaltonen et al. |
| 2003/0183938 A1 | 10/2003 | Wai et al. |
| 2003/0201537 A1 | 10/2003 | Lane et al. |
| 2003/0212285 A1 | 11/2003 | Uhlenbrock et al. |
| 2004/0005753 A1 | 1/2004 | Kostamo et al. |
| 2004/0038529 A1 | 2/2004 | Soininen et al. |
| 2004/0105934 A1 | 6/2004 | Chang et al. |
| 2004/0113279 A1 * | 6/2004 | Chen et al. .................. 257/774 |
| 2004/0144311 A1 | 7/2004 | Chen et al. |
| 2004/0214354 A1 | 10/2004 | Marsh et al. |
| 2004/0224500 A1 | 11/2004 | Cho |
| 2004/0241321 A1 | 12/2004 | Ganguli et al. |
| 2004/0266167 A1 * | 12/2004 | Dubin et al. ................ 438/619 |
| 2005/0006799 A1 | 1/2005 | Gregg et al. |
| 2005/0081882 A1 | 4/2005 | Greer et al. |
| 2005/0085031 A1 | 4/2005 | Lopatin et al. |
| 2005/0238808 A1 | 10/2005 | Gatineau et al. |

FOREIGN PATENT DOCUMENTS

| | | |
|---|---|---|
| JP | 2001-111000 | 4/2001 |
| JP | 2001111000 | 4/2001 |
| JP | 2001-237400 | 8/2001 |
| WO | WO 01/088972 | 11/2001 |
| WO | WO 03/056612 | 7/2003 |
| WO | WO 2005/020317 | 3/2005 |

OTHER PUBLICATIONS

Aaltonen, et al., "Atomic Layer Deposition of Ruthenium Thin Films from Ru(thd)$_3$ and Oxygen," Chem. Vap. Deposition (2004), 10, No. 4 pp. 215-219.

Aaltonen, et al., "Ruthenium Thin Films Grown by Atomic Layer Deposition," Chem. Vap. Deposition (2003), 9, No. 1 pp. 45-49.

Aoyama, et al., "Ruthenium Films Prepared by Liquid Source Chemical Vapor Deposition Using Bis-(ethylcyclopentadienyl)ruthenium," Jpn. J. Appl. Phys. vol. 38 (1999) pp. L1134-L1136.

Dadgar, et al., "Growth of Ru doped semi-insulating InP by low pressure metalorganic chemical vapor deposition," Journal of Crystal Growth 195 (1998) pp. 69-73.

International Search Report dated Mar. 11, 2005 regarding International Application No. PCT/US2004/024805.

Kwon, et al., "Atomic Layer Deposition of Ruthenium Thin Films for Copper Glue Layer," Journal of the Electrochemical Society, 151 (2) (2004) pp. G109-G112.

Kwon, et al., "Plasma-Enhanced Atomic Layer Deposition of Ruthenium Thin Films," Electrochemical and Solid-State Letters, 7 (4) (2004) pp. C46-C48.

Lashdaf, et al., "Deposition of palladium and ruthenium β-diketonates on alumina and silica supports in gas and liquid phase," Applied Catalysis A: General 241 (2003) pp. 51-63.

Lim, et al., "Atomic layer deposition of transition metals," Nature Materials, vol. 2 Nov. (2003) pp. 749-754.

Shibutami, et al., "A Novel Ruthenium Precursor for MOCVD without Seed Ruthenium Layer," TOSOH Research & Technology Review, vol. 47 (2003) pp. 61-64.

U.S. Appl. No. 11/061,039, filed Feb. 19, 2005.

Meyer, et al. "Controlled dewetting processes on microstructured surfaces—a new procedure for thin film microstructuring", Macromol. Mater. Eng. 276/277 (2000) pp. 44-50.

International Search Report dated Jul. 29, 2005 regarding International Application No. PCT/US2005/010203.

Meda, et al. "Chemical Vapor Deposition of Ruthenium Dioxide Thin Films From Bis(2, 4-dimethylpentadienyl) Ruthenium," Chemical Aspects of Electronic Ceramics Processing, Symposium Mater. Res. Soc., Warrendale, PA, USA, 1998, pp. 75-80, XP009050315, ISBN: 1-55899-400-9.

Aaltonen "Atomic Layer Deposition of Noble Metal Thin Films," Academic Dissertation presented at the Department of Chemistry of the University of Helsinki on Apr. 8, 2005, Helsinki, Finland, pp. 1-71.

Dadgar, et al. "Ruthenium: A superior compensator of InP," Applied Physics Letters, vol. 73, No. 26, Dec. 28, 1998, American Institute of Physics, pp. 3878-3880.

Dey, et al. "Ruthenium films by digital chemical vapor deposition: Selectivity, nanostructure, and work function," Applied Physics Letter, vol. 84, No. 9, Mar. 1, 2004, American Institute of Physics, pp. 1606-1608.

Goswami, et al. Transition Metals Show Promise as Copper Barriers, Semiconductor International, ATMI, San Jose-May 1, 2004.

Kwon, et al. "PEALD of Ruthenium Adhesion Layer for Copper Interconnects," Journal of the Electrochemical Society, 151 (12) (2004), pp. C753-C756.

Sun, et al. "Properties of Ru Thin Films Fabricated on TiN by Metal-Organic Chemical Vapor Deposition," Japanese Journal of Applied Physics, vol. 43, No. 4A, 2004, The Japan Society of Applied Physics, pp. 1566-1570.

* cited by examiner

US 7,265,048 B2

REDUCTION OF COPPER DEWETTING BY TRANSITION METAL DEPOSITION

BACKGROUND OF THE INVENTION

1. Field of the Invention

The present invention generally relates to a metallization process for manufacturing semiconductor devices. More particularly, the present invention relates to preventing copper dewetting by depositing a transition metal that helps preserve the copper crystal structure and promote adhesion between copper and other materials.

2. Description of the Related Art

Copper is the current metal of choice for use in multilevel metallization processes that are crucial to semiconductor device manufacturing. The multilevel interconnects that drive the manufacturing processes require planarization of high aspect ratio apertures including contacts, vias, lines, and other features. Filling the features without creating voids or deforming the feature geometry is more difficult when the features have higher aspect ratios. Reliable formation of interconnects is also more difficult as manufacturers strive to increase circuit density and quality.

As the use of copper has permeated the marketplace because of its relative low cost and processing properties, semiconductor manufacturers continue to look for ways to improve the boundary regions between copper and dielectric material by reducing copper diffusion and dewetting. Several processing methods have been developed to manufacture copper interconnects as feature sizes have decreased. Each processing method may increase the likelihood of errors such as copper diffusion across boundary regions, copper crystalline structure deformation, and dewetting. Physical vapor deposition (PVD), chemical vapor deposition (CVD), atomic layer deposition (ALD), chemical mechanical polishing (CMP), electrochemical plating (ECP), electrochemical mechanical polishing (ECMP), and other methods of depositing and removing copper layers utilize mechanical, electrical, or chemical methods to manipulate the copper that forms the interconnects. Barrier and capping layers may be deposited to contain the copper.

In the past, a layer of tantalum, tantalum nitride, or copper alloy with tin, aluminum, or magnesium was used to provide a barrier layer or an adhesion promoter between copper and other materials. These options are costly or only partially effective or both. As the copper atoms along the boundary regions experience changes in temperature, pressure, atmospheric conditions, or other process variables common during multiple step semiconductor processing, the copper may migrate along the boundary regions and become agglomerated copper. The copper may also be less uniformly dispersed along the boundary regions and become dewetted copper. These changes in the boundary region include stress migration and electromigration of the copper atoms. The stress migration and electromigration of copper across the dielectric layers or other structures increases the resistivity of the resulting structures and reduces the reliability of the resulting devices.

Preventing agglomeration of copper, especially when seed layers of copper are deposited on dielectric or other materials, is a research goal. Reducing deviation from ideal copper crystalline structure and discouraging copper dewetting is important. Finally, it is desirable to decrease the likelihood of diffusion of copper into dielectric, barrier, or other layers.

SUMMARY OF THE INVENTION

The present invention generally provides a method and apparatus for forming a transition metal layer on a surface prior to metal deposition to minimize dewetting while maintaining the desired crystalline structure of the metal.

The present invention also generally provides a method and apparatus for depositing layers on a substrate comprising forming a copper seed layer on a substrate surface having apertures, depositing a transition metal layer over the copper seed layer, and depositing a bulk copper layer over the transition metal layer.

The invention also generally provides a method and apparatus for depositing layers on a substrate comprising forming a via through a dielectric to reveal a metal at the base of the via, depositing a transition metal layer on the metal at the base of the via, and depositing copper on the transition metal layer. A punch through step may optionally be performed.

The present invention generally provides a method and apparatus for depositing layers on a substrate comprising depositing a transition metal layer on a bulk metal layer and optionally depositing an additional capping layer on the transition metal layer.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION

The present invention uses a transition metal to prevent copper dewetting and to stabilize copper crystalline structure in interconnect boundary regions. The transition metal, for example, ruthenium, improves copper boundary region properties to promote adhesion, decrease diffusion and agglomeration, and encourage uniform roughness and wetting of the substrate surface during processing. Deposition of ruthenium to improve the dewetting of a copper seed layer before bulk fill copper deposition is presented. Deposition of ruthenium to help preserve the copper crystallinity in the base of a via is also presented. Deposition of ruthenium after copper has been deposited to fill a via before an optional additional capping layer is deposited is presented.

Figure 1:
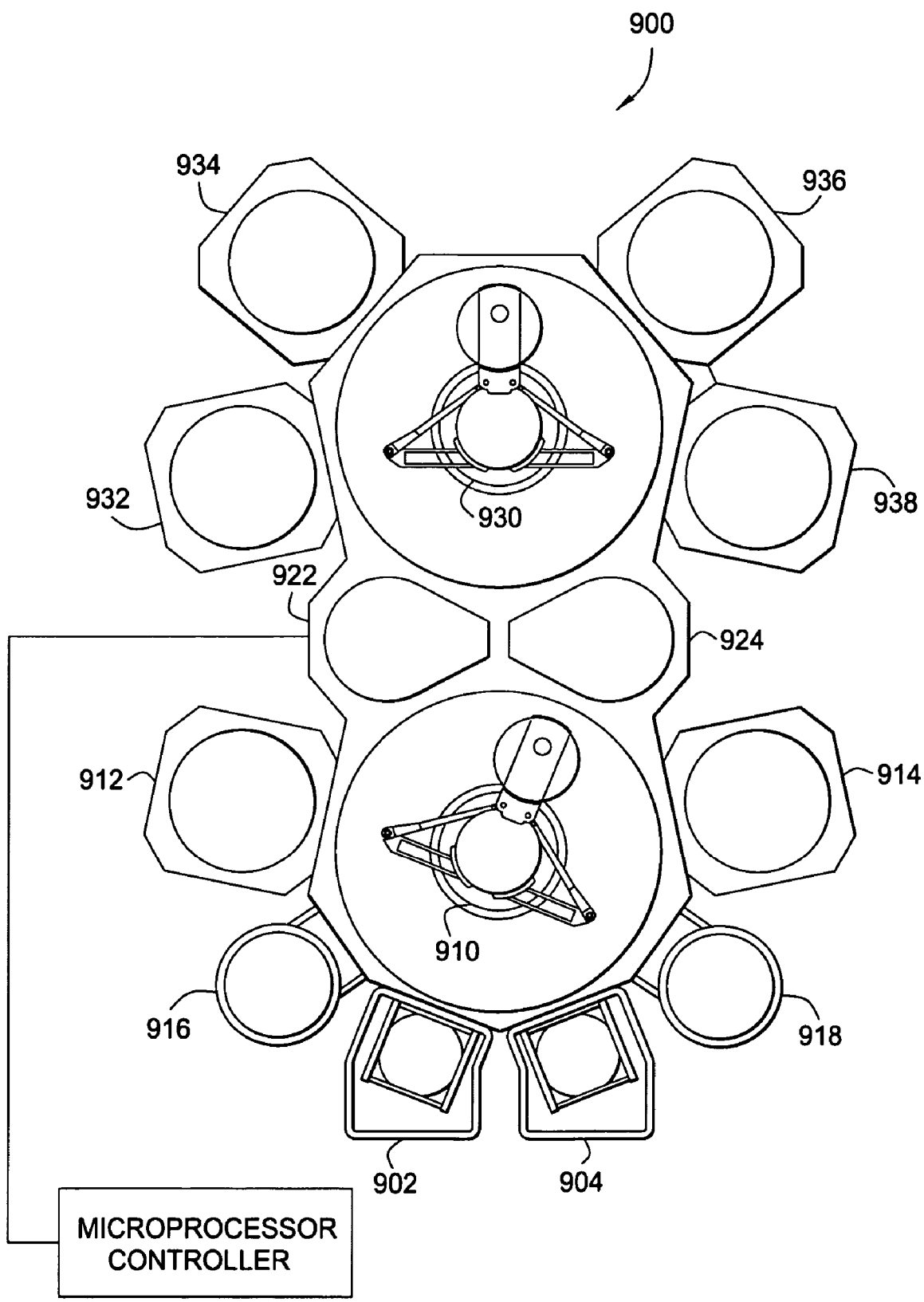
FIG. 1 is a schematic plan view of a processing platform.

FIG. 1 is a schematic top-view diagram of an exemplary multi-chamber processing system 900. A similar multi-chamber processing system is disclosed in commonly assigned U.S. Pat. No. 5,186,718, entitled "Staged Vacuum Wafer Processing System and Method," issued on Feb. 16, 1993, which is hereby incorporated by reference herein. The system 900 generally includes load lock chambers 902 and 904 for the transfer of substrates into and out of the system 900. Because the system 900 is under vacuum, the load lock chambers 902 and 904 may "pump down" the substrates introduced into the system 900. A first robot 910 transfers the substrates between the load lock chambers 902 and 904, and one or more substrate processing chambers 912, 914, 916, and 918 (four are shown). Each processing chamber 912, 914, 916, and 918, can be outfitted to perform a number of substrate processing operations such as ALD, CVD, PVD, etch, pre-clean, de-gas, orientation, and other processes. The first robot 910 also transfers substrates to and from one or more transfer chambers 922 and 924.

The transfer chambers 922 and 924 are used to maintain ultrahigh vacuum conditions while allowing substrates to be transferred within the system 900. A second robot 930 may transfer the substrates between the transfer chambers 922 and 924 and one or more processing chambers 932, 934, 936, and 938. Similar to processing chambers 912, 914, 916, and 918, the processing chambers 932, 934, 936, and 938 can be outfitted to perform a variety of substrate processing operations, such as ALD, CVD, PVD, etch, pre-clean, de-gas, and orientation, for example. Any of the substrate processing chambers 912, 914, 916, 918, 932, 934, 936, and 938 may be removed from the system 900.

In one arrangement of an embodiment, processing chamber 916 and 918 may be an anneal chamber and each processing chamber 912 and 914 may be an ALD chamber, CVD chamber, or PVD chamber adapted to deposit a barrier layer.

Processing chambers 932 and 938 may be an ALD chamber, CVD chamber, or PVD chamber adapted to deposit a copper layer. Further, processing chambers 934 and 936 may be an ALD chamber, CVD chamber, PVD chamber, or combinations thereof adapted to deposit a ruthenium layer. Processing chambers 934 and 936 may be an ALD/CVD hybrid chamber, such as disclosed in the co-assigned, pending U.S. patent application Ser. No. 10/712,690, filed Nov. 13, 2003, entitled, "Apparatus and Method for Hybrid Chemical Processing," which is hereby incorporated by reference herein. Another process chamber configured to operate in both an ALD mode as well as a conventional CVD mode is described in commonly assigned U.S. patent application Ser. No. 10/016,300, filed on Dec. 12, 2001, entitled, "Lid Assembly for a Processing System to Facilitate Sequential Deposition Techniques," which is incorporated by reference herein.

In an additional embodiment, process chambers 916 and 918 may be pre-clean chambers and process chambers 912 and 914 may be de-gas chambers. Process chambers 932 and 938 may be configured for ALD or PVD barrier layer deposition. Additionally, process chambers 934 and 936 may be configured to deposit a seed layer by ALD, PVD, or CVD. Alternatively, process chambers 934 and 936 may be configured to deposit a liner layer by ALD or CVD. Any one particular arrangement of the system 900 is provided to illustrate the invention and should not be use to limit the scope of the invention.

Figure 2:
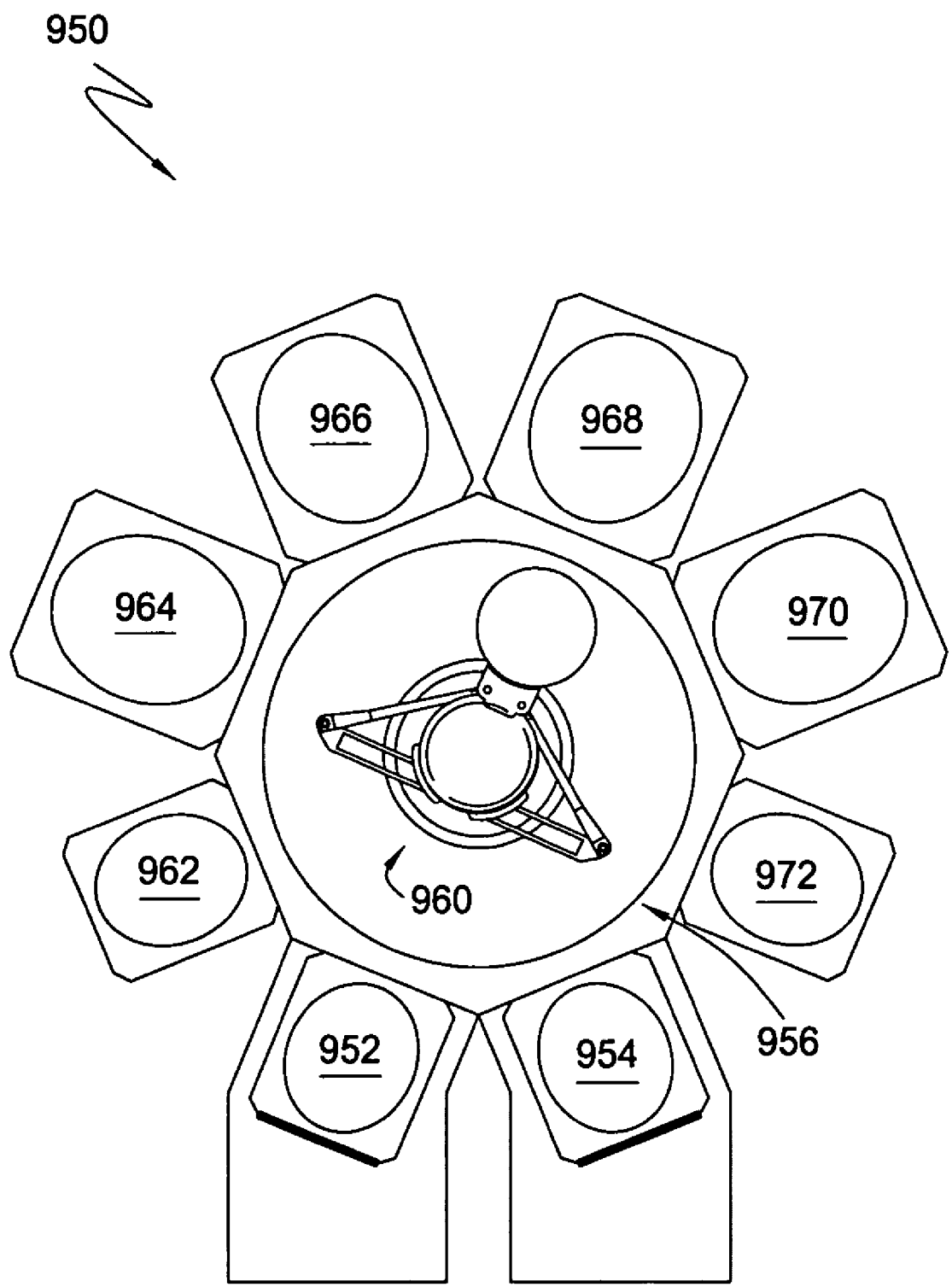
FIG. 2 is a schematic plan view of an alternative processing platform.

FIG. 2 is a schematic top-view diagram of an exemplary multi-chamber processing system 950. The system 950 generally includes load lock chambers 952 and 954 for the transfer of substrates into and out from the system 950. Typically, since the system 950 is under vacuum, the load lock chambers 952 and 954 may "pump down" the substrates introduced into the system 950. A robot 960 may transfer the substrates between the load lock chambers 952 and 954, and substrate processing chambers 962, 964, 966, 968, 970, and 972. Each processing chamber 962, 964, 966, 968, 970, and 972 can be outfitted to perform a number of substrate processing operations such as ALD, CVD, PVD, etch, pre-clean, de-gas, heat, orientation, and other substrate processes. The robot 960 also transfers substrates to and from a transfer chamber 956. Any of the substrate processing chambers 962, 964, 966, 968, 970, and 972 may be removed from the system 950 if not necessary for a particular process to be performed by the system 950.

Figure 3:
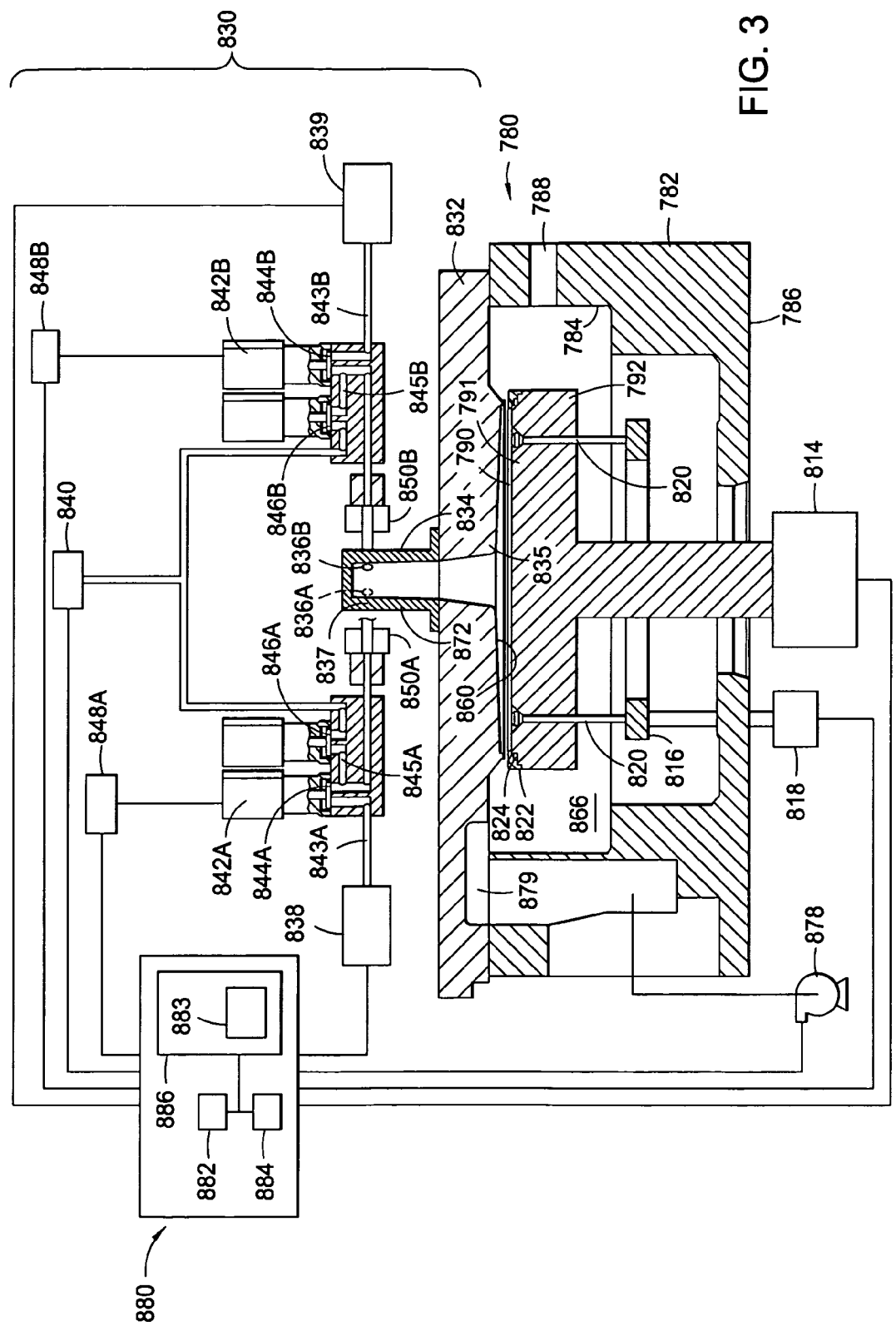
FIG. 3 is a schematic cross-sectional view of a process chamber that may be used to perform a cyclical deposition process.

FIG. 3 is a schematic cross-sectional view of one embodiment of a process chamber 780 including a gas delivery apparatus 830 adapted for cyclic deposition, such as ALD. A detailed description for a process chamber 780 is described in commonly assigned U.S. patent application Ser. No. 10/032,284, entitled, "Gas Delivery Apparatus and Method for Atomic Layer Deposition," filed Dec. 21, 2001, and commonly assigned U.S. patent application Ser. No. 10/281, 079, entitled "Gas Delivery Apparatus for Atomic Layer Deposition," filed Oct. 25, 2002, which are hereby incorporated by reference herein. The process chamber 780 may also be adapted for other deposition techniques.

The process chamber 780 comprises a chamber body 782 having sidewalls 784 and a bottom 786. A slit valve 788 in the process chamber 780-provides access for a robot (not shown) to deliver and retrieve a substrate 790, such as a semiconductor substrate with a diameter of 200 mm or 300 mm or a glass substrate, from the process chamber 780.

A substrate support 792 supports the substrate 790 on a substrate receiving surface 791 in the process chamber 780. The substrate support 792 is mounted to a lift motor 814 to raise and lower the substrate support 792 and a substrate 790 disposed thereon. A lift plate 816 connected to a lift motor 818 is mounted in the process chamber 780 and raises and lowers pins 820 movably disposed through the substrate support 792. The pins 820 raise and lower the substrate 790 over the surface of the substrate support 792. The substrate support 792 may include a vacuum chuck, an electrostatic chuck, or a clamp ring for securing the substrate 790 to the substrate support 792 during processing.

The substrate support 792 may be heated to increase the temperature of a substrate 790 disposed thereon. For example, the substrate support 792 may be heated using an embedded heating element, such as a resistive heater, or may be heated using radiant heat, such as heating lamps disposed above the substrate support 792. A purge ring 822 may be disposed on the substrate support 792 to define a purge channel 824 which provides a purge gas to a peripheral portion of the substrate 790 to prevent deposition thereon.

A gas delivery apparatus 830 is disposed at an upper portion of the chamber body 782 to provide a gas, such as a process gas or a purge gas, to the chamber 780. A vacuum system 878 is in communication with a pumping channel 879 to evacuate any desired gases from the process chamber 780 and to help maintain a desired pressure or a desired pressure range inside a pumping zone 866 of the process chamber 780.

In one embodiment, the process chamber depicted by FIG. 3 permits the process gas or purge gas to enter the process chamber 780 normal (i.e., 90°) with respect to the plane of the substrate 790 via the gas delivery apparatus 830. Therefore, the surface of substrate 790 is symmetrically exposed to gases that allow uniform film formation on substrates. The process gas includes a first reagent during one pulse and includes a second reagent in another pulse.

Process chamber 780, depicted in FIG. 3, produces a uniform film and employs a short cycle time (as quick as tenths of a second pulse) to purge and short time to dose the substrate to saturation with precursors. The short dosing time is important because many of the ruthenium-containing compounds have the inherent characteristic of a low vapor pressure. The low vapor pressure correlates to less precursor saturating the carrier gas per time and temperature, therefore, more time is needed to saturate the surface of the substrate with ruthenium-containing precursor (e.g., bis(2, 4-dimethylpentadienyl)ruthenium) than a traditional precursor with a higher vapor pressure (e.g., $TiCl_4$).

In one embodiment, the gas delivery apparatus 830 comprises a chamber lid 832. The chamber lid 832 includes an expanding channel 834 extending from a central portion of the chamber lid 832 and a bottom surface 860 extending from the expanding channel 834 to a peripheral portion of the chamber lid 832. The bottom surface 860 is sized and shaped to substantially cover a substrate 790 on the substrate support 792. The expanding channel 834 has gas inlets 836A, 836B to provide gas flows from two similar valves 842A, 842B. The gas flows from the valves 842A, 842B may be provided together or separately.

In one configuration, valve 842A and valve 842B are coupled to separate reactant gas sources but are preferably coupled to the same purge gas source. For example, valve 842A is coupled to reactant gas source 838 and valve 842B is coupled to reactant gas source 839, and both valves 842A, 842B are coupled to purge gas source 840. Each valve 842A, 842B includes a delivery line 843A, 843B having a valve seat assembly 844A, 844B and includes a purge line 845A, 845B having a valve seat assembly 846A, 846B. The delivery line 843A, 843B connects with the reactant gas source 838, 839 and the gas inlet 836A, 836B of the expanding channel 834. The valve seat assembly 844A, 844B of the delivery line 843A, 843B controls the flow of the reactant gas from the reactant gas source 838, 839 to the expanding channel 834. The purge line 845A, 845B connects with the purge gas source 840 and intersects the delivery line 843A, 843B downstream of the valve seat assembly 844A, 844B of the delivery line 843A, 843B. The valve seat assembly 846A, 846B of the purge line 845A, 845B controls the flow of the purge gas from the purge gas source 840 to the delivery line 843A, 843B. If a carrier gas is used to deliver reactant gases from the reactant gas source 838, 839, preferably the same gas is used as a carrier gas and a purge gas (i.e., an argon gas used as a carrier gas and a purge gas).

Each valve seat assembly 844A, 844B, 846A, 846B may comprise a diaphragm and a valve seat. The diaphragm may be biased open or closed and may be actuated closed or open respectively. The diaphragms may be pneumatically actuated or may be electrically actuated. Examples of pneumatically actuated valves include pneumatically actuated valves available from Fujiken and Veriflow. Examples of electrically actuated valves include electrically actuated valves available from Fujiken. Programmable logic controllers 848A, 848B may be coupled to the valves 842A, 842B to control actuation of the diaphragms of the valve seat assemblies 844A, 844B, 846A, 846B of the valves 842A, 842B. Pneumatically actuated valves may provide pulses of gases in time periods as low as about 0.020 seconds. Electrically actuated valves may provide pulses of gases in time periods as low as about 0.005 seconds. An electrically actuated valve typically requires the use of a driver coupled between the valve and the programmable logic controller.

Each valve 842A, 842B may be a zero dead volume valve to enable flushing of a reactant gas from the delivery line 843A, 843B when the valve seat assembly 844A, 844B of the valve is closed. For example, the purge line 845A, 845B may be positioned adjacent the valve seat assembly 844A, 844B of the delivery line 843A, 843B. When the valve seat assembly 844A, 844B is closed, the purge line 845A; 845B may provide a purge gas to flush the delivery line 843A, 843B. In the embodiment shown, the purge line 845A, 845B is positioned slightly spaced from the valve seat assembly 844A, 844B of the delivery line 843A, 843B so that a purge gas is not directly delivered into the valve seat assembly 844A, 844B when open. A zero dead volume valve as used herein is defined as a valve which has negligible dead volume (i.e., not necessary zero dead volume).

Each valve 842A, 842B may be adapted to provide a combined gas flow and/or separate gas flows of the reactant gas 838, 839 and the purge gas 840. One example of a combined gas flow of the reactant gas 838 and the purge gas 840 provided by valve 842A comprises a continuous flow of a purge gas from the purge gas source 840 through purge line 845A and pulses of a reactant gas from the reactant gas source 838 through delivery line 843A. The continuous flow of the purge gas may be provided by leaving diaphragm of the valve seat assembly 846A of the purge line 845A open. The pulses of the reactant gas from the reactant gas source 838 may be provided by opening and closing the diaphragm of the valve seat assembly 844A of the delivery line 843A. One example of separate gas flows of the reactant gas 838 and the purge gas 840 provided by valve 842A comprises pulses of a purge gas from the purge gas source 840 through purge line 845A and pulses of a reactant gas from the reactant gas source 838 through delivery line 843A. The pulses of the purge gas may be provided by opening and closing the diaphragm of the valve seat assembly 846A of the purge line 845A open. The pulses of the reactant gas from the reactant gas source 838 may be provided by opening and closing the diaphragm valve seat assembly 844A of the delivery line 843A.

The delivery lines 843A, 843B of the valves 842A, 842B may be coupled to the gas inlets 836A, 836B through gas conduits 850A, 850B. The gas conduits 850A, 850B may be integrated or may be separate from the valves 842A, 842B. In one aspect, the valves 842A, 842B are coupled in close proximity to the expanding channel 834 to reduce any unnecessary volume of the delivery line 843A, 843B and the gas conduits 850A, 850B between the valves 842A, 842B and the gas inlets 836A, 836B.

In FIG. 3, the expanding channel 834 comprises a channel which has an inner diameter which increases from an upper portion 837 to a lower portion 835 of the expanding channel 834 adjacent the bottom surface 860 of the chamber lid 832.

In one embodiment, the inner diameter of the expanding channel 834 for a chamber adapted to process 200 mm diameter substrates is between about 0.2 inches (0.51 cm) and about 1.0 inches (2.54 cm) at the upper portion 837 of the expanding channel 834 and between about 0.5 inches (1.27 cm) and about 3.0 inches (7.62 cm) at the lower portion 835 of the expanding channel 834.

In another specific embodiment, the inner diameter of the expanding channel 834 for a chamber adapted to process 300 mm diameter substrates is between about 0.2 inches (0.51 cm) and about 1.0 inches (2.54 cm) at the upper portion 837 of the expanding channel 134 and between about 0.5 inches (1.27 cm) and about 3.0 inches (7.62 cm) at the lower portion 835 of the expanding channel 834 for a 300 mm substrate. In general, the above dimensions apply to an expanding channel adapted to provide a total gas flow of between about 500 sccm and about 3,000 sccm.

In other embodiments, the dimension may be altered to accommodate a certain gas flow. In general, a larger gas flow will require a larger diameter expanding channel. In one embodiment, the expanding channel 834 may be shaped as a truncated cone (including shapes resembling a truncated cone). Whether a gas is provided toward the walls of the expanding channel 834 or directly downward towards the substrate, the velocity of the gas flow decreases as the gas flow travels through the expanding channel 834 due to the expansion of the gas. The reduction of the velocity of the gas helps reduce the likelihood the gas will blow off reactants absorbed on the surface of the substrate 790.

The diameter of the expanding channel 834, which is gradually increasing from the upper portion 837 to the lower portion 835 of the expanding channel, allows less of an adiabatic expansion of a gas through the expanding channel 834 which helps to control the temperature of the gas. For instance, a sudden adiabatic expansion of a gas delivered through the gas inlet 836A, 836B into the expanding channel 834 may result in a drop in the temperature of the gas which may cause condensation of the precursor vapor and formation of particles. Alternatively, a gradually expanding channel 834 according to embodiments of the present invention is believed to provide less of an adiabatic expansion of a gas. Therefore, more heat may be transferred to or from the gas, and, thus, the temperature of the gas may be more easily controlled by controlling the surrounding temperature of the gas or controlling the temperature of the chamber surfaces such as the chamber lid 832. The gradually expanding channel may comprise one or more tapered inner surfaces, such as a tapered straight surface, a concave surface, a convex surface, or combinations thereof or may comprise sections of one or more tapered inner surfaces (i.e., a portion tapered and a portion non-tapered).

In one embodiment, the gas inlets 836A, 836B are located adjacent the upper portion 837 of the expanding channel 834. In other embodiments, one or more gas inlets may be located along the length of the expanding channel 834 between the upper portion 837 and the lower portion 835.

In FIG. 3, a control unit 880, such as a programmed personal computer, work station computer, or the like, may be coupled to the process chamber 780 to control processing conditions. For example, the control unit 880 may be configured to control flow of various process gases and purge gases from gas sources 838, 839, 840 through the valves 842A, 842B during different stages of a substrate process sequence. Illustratively, the control unit 880 comprises a central processing unit (CPU) 882, support circuitry 884, and memory 886 containing associated control software 883.

Figure 4:
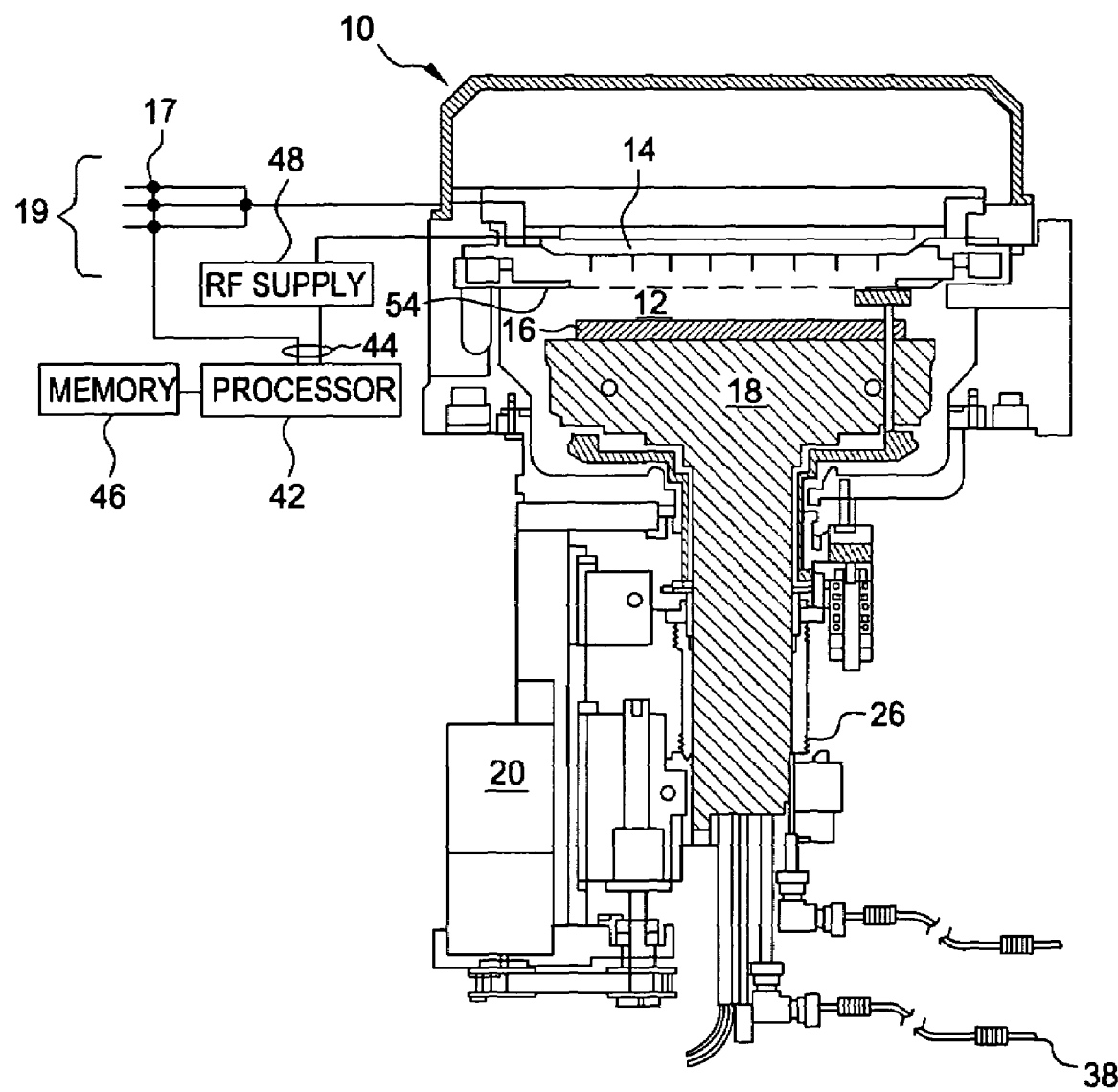
FIG. 4 is a vertical, cross-sectional view of one embodiment of a chemical vapor deposition apparatus.

FIG. 4 illustrates one embodiment of a parallel plate, cold-wall chemical vapor deposition system 10 having a vacuum chamber 12 in which the metal film according to the present invention can be deposited. CVD System 10 contains a gas distribution manifold 14 for dispersing deposition gases to a substrate 16 that rests on a resistively-heated susceptor 18. Chamber 12 may be part of a vacuum processing system having multiple processing chambers connected to a central transfer chamber and serviced by a robot.

Edge purge gases are flowed through purge guide 54 across the edge of substrate 16 to prevent deposition gases from contacting the edge and backside of the substrate. Purge gases are also flowed around heater/susceptor 18 to minimize deposition on and around the heater/susceptor. These purge gases are supplied from a purge line (not shown) and are also employed to protect stainless steel bellows 26 from damage by corrosive gases introduced into the chamber during processing.

Deposition and carrier gases are supplied to a deposition zone of the chamber through gas lines 19 to manifold 14 in response to the control of valves 17. During processing, gas supplied to manifold 14 is distributed uniformly across the surface of the substrate. Exhaust processing gases and by-product gases are evacuated from the chamber by means of exhaust system 36. The rate at which gases are released through exhaust system 36 into an exhaust line is controlled by a throttle valve (not shown). During deposition, a second purge gas through gas channels in the susceptor (not shown) and purge guide 54 feeds purge gas against the edge of substrate 16. An RF power supply 48 can be coupled to manifold 14 to provide for plasma-enhanced CVD (PECVD) cleaning of the chamber.

The throttle valve, gas supply valves 17, motor 20, resistive heater coupled to susceptor 18, RF power supply 48 and other aspects of CVD system 10 are controlled by a system controller 42 over control lines 44 (only some of which are shown). System processor 42 operates under the control of a computer program stored in a computer-readable medium such as a memory 46. The computer program dictates the temperature, chamber pressure, timing, mixture of gases, RF power levels, susceptor position, and other parameters of a particular process.

A PVD chamber may be used to deposit ruthenium. Chambers that may be used include IMP™ chambers, ALPS™ chambers, and DURASOURCE™ chambers, all of which are available from Applied Materials, Inc., of Santa Clara, Calif. Other chambers that may be used include STANDARD™ and COHERENT™ chambers, available from Applied Materials, Inc., of Santa Clara, Calif. A layer of metal is deposited by PVD at a high power, such as between about 5 and about 60 kilowatts, e.g., about 10 kilowatts. The power density may be between about 0.04 and about 0.48 kilowatts per square inch, e.g., about 0.08 kilowatts per square inch. PVD chambers that may be used to deposit the metal layer include Standard and ALPS™ chambers. The chamber pressure during PVD may be between about 0.5 mTorr and 5 mTorr. The thickness of the deposited layer may increase or decrease depending on the size of the feature. Smaller features require less material and larger features require more material. The PVD may be performed without any backside gas or chucking. Therefore, while the temperature in the PVD chamber may be between about 400° C. and about 550° C., the substrate temperature may be between about 25° C. and about 300° C.

The substrate may then be treated with another PVD step to deposit additional metal. The metal may be deposited by PVD at a high power, such as between about 5 and about 60 kilowatts, for example, about 10 kilowatts. The power density may be between about 0.04 and about 0.48 kilowatts per square inch, such as about 0.08 kilowatts per square inch. The metal may fill a via if the via was not previously filled or improve the surface morphology of the substrate. The PVD is performed at a high temperature, e.g., between about 400° C. and about 550° C. The temperature of both the PVD chamber and the substrate is preferably between about 400° C. and about 550° C. The high power of the PVD process contributes to a fast PVD step that increases the throughput of substrates during processing. Furthermore, it is believed that the high power used during PVD contributes to the deposition of more uniformly sized grains than a lower power and slower PVD process.

Figure 5A:
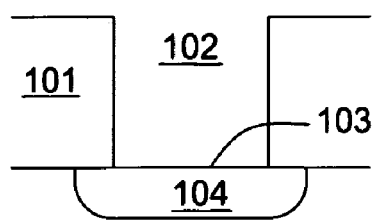
FIGS. 5A to 5E are schematic diagrams of a metallized via.
Figure 5B:
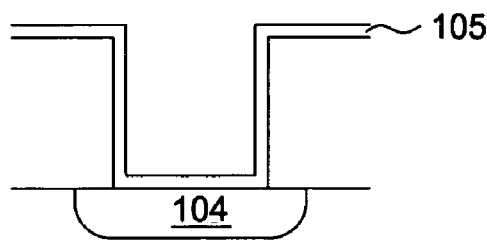

FIGS. 5A to 5E illustrate a ruthenium layer between a copper seed layer and a bulk copper fill layer. It is believed that the presence of a ruthenium layer has a minimal effect on resistivity and decreases the likelihood of copper dewetting. FIG. 5A illustrates an interlayer dielectric layer 101 having a via 102 formed therein with a base 103 that reveals a metal feature 104 such as a copper feature deposited below the dielectric layer 101. FIG. 5B shows an optional barrier layer 105 conformally deposited on the interlayer dielectric layer 101 such as by ALD. The optional barrier layer 105 may have a thickness of about 1 to about 20 Å. The optional barrier layer may be a tantalum/tantalum nitride layer deposited by ALD. The ALD may be performed by exposing the substrate to repetitions of alternating tantalum containing precursor and nitrogen containing precursor using an ALD deposition chamber such as the equipment illustrated by FIG. 3. The optional barrier layer 105 may also be deposited by PVD or CVD. The optional barrier layer 105 CVD process may be performed by using a CVD deposition chamber such as the equipment depicted by FIG. 4. If PVD is used as the deposition method for the optional barrier layer 105, the tantalum nitride and tantalum layers may be deposited followed by an etching step, or a tantalum nitride layer may be deposited followed by an etching step followed by an additional tantalum deposition step. The subsequent etching step opens the bottom of the feature down to the metal feature 104. Alternatively, ruthenium may be deposited as layer 105. The ruthenium layer can be deposited by CVD or PVD.

Figure 5C:
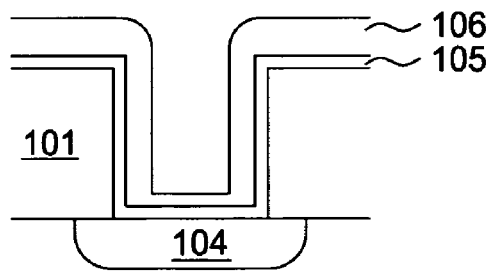

FIG. 5C illustrates a copper seed layer 106 deposited on the optional barrier layer 105. The copper can be deposited by ALD, PVD or CVD and has a thickness of about 50 Å to about 1500 Å. PVD is preferably the process used to deposit the copper seed layer 106. Alternatively, the copper seed layer 106 may be deposited by alternating a copper containing precursor and a reducing agent using equipment as shown in FIG. 3.

Figure 5D:
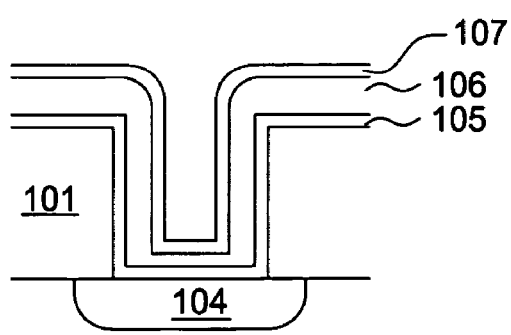
Figure 5E:
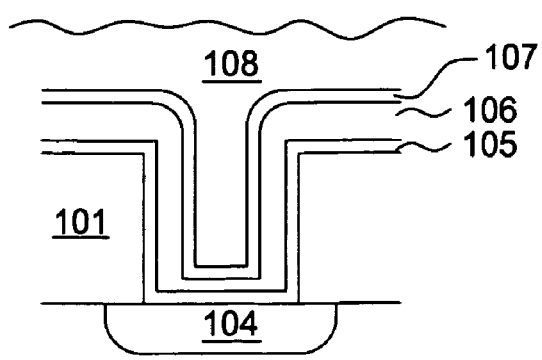

Next, FIG. 5D illustrates a transition metal layer, such as a ruthenium layer 107 deposited on the copper seed layer 106. The transition metal layer 107 is intended to lock the grain boundaries of the copper seed layer to minimize agglomeration. Accordingly, it is believed that the transition metal layer 107 does not need to be continuous, but can be continuous. The ruthenium layer 107 may be deposited by thermal decomposition of a ruthenium containing precursor carried by an inert gas. The substrate may be heated to between about 100° C. to about 400° C. during a thermal decomposition process. Ruthenium precursors include $Ru(Cp)_2$, $Ru(EtCp)_2$, Ru(EtCp) 2,4, dimethyl pentadienyl, bis(2,4,dimethyl pentadienyl) ruthenium, Ru(EtCp)(MeCp), $Ru(THD)_3$, and others. Ru(EtCp)(MeCp) is preferred. Alternatively, the ruthenium layer 107 may be deposited by exposing the substrate to a ruthenium containing precursor gas in an ALD or CVD process. The deposited ruthenium layer may be discontinuous. The ALD ruthenium may be deposited using the equipment shown in FIG. 3. ALD ruthenium is described in U.S. patent application Ser. No. 10/811,230 "Ruthenium Layer Formation for Copper Film Deposition," filed on Mar. 26, 2004, which is hereby incorporated by reference herein. A ruthenium layer may be deposited by PVD, but the deposited film may be discontinuous or nonuniform, inconsistent thickness. FIG. 5E shows a bulk copper layer 108 deposited over the transition metal layer 107 by ECP. It is believed that the transition metal layers facilitate the ECP process when the seed layer is thin and/or discontinuous. The transition metal layer, e.g. ruthenium, provides a conductive bridge across the surface of the substrate to facilitate current distribution across the substrate and across areas where the seed layer may be discontinuous. The bulk copper layer 108 may also be deposited by PVD or other deposition method.

Figure 6A:
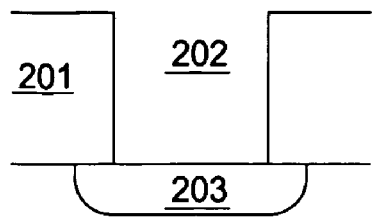
FIGS. 6A to 6E are schematic diagrams of an alternative embodiment of a metallized via.
Figure 6B:
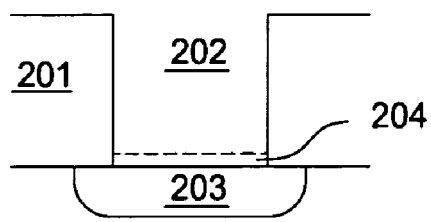
Figure 6C:
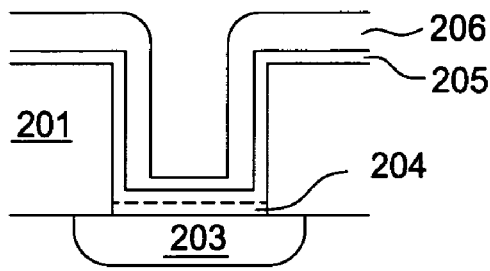

FIGS. 6A to 6E illustrate an additional embodiment with a transition metal layer, such as a ruthenium layer deposited at the base of via 202. FIG. 6A shows an interlayer dielectric 201 having a via 202 formed therein that reveals a copper layer 203 beneath the dielectric layer 201. FIG. 6B illustrates a ruthenium layer 204 selectively deposited along the base of via 202. The ruthenium layer 204 has a thickness of about 50 Å to about 1500 Å and may be deposited by the same processes as described for the ruthenium layer 107 in FIG. 5D. The ruthenium layer 204 in the base of via 202 is believed to promote the stability of the copper layer at the base of via 202. FIG. 6C has an optional tantalum nitride barrier layer 205 such as a tantalum/tantalum nitride barrier layer, conformally deposited over the surface of the via and the field of the substrate. The barrier layer may be deposited by ALD, PVD, or CVD. The ALD is performed by exposing the substrate to repetitions of alternating tantalum containing precursor and nitrogen containing precursor using the equipment shown in FIG. 3. CVD may be performed by using the equipment shown in FIG. 4.

Figure 6D:
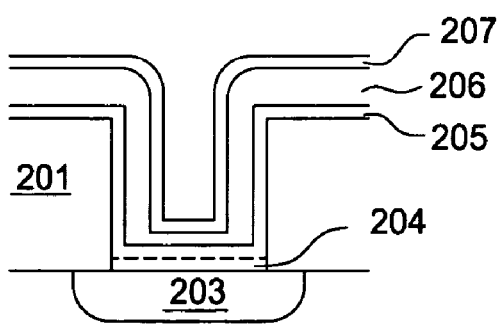
Figure 6E:
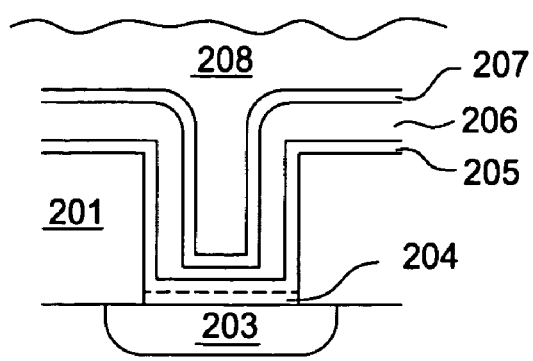

FIG. 6C also shows a seed layer 206, such as a copper layer deposited by PVD on top of the optional tantalum nitride layer 205 and ruthenium layer 204. The copper layer 206 preferably has a thickness of about 5 Å to about 50 Å. FIG. 6D illustrates a ruthenium layer 207 deposited conformally on the copper layer 206. The ruthenium layer 207 is deposited by the same processes as described for the ruthenium layer 107 in FIG. 5D. Finally, FIG. 6E displays a bulk copper layer 208 that is deposited by ECP.

Figure 7A:
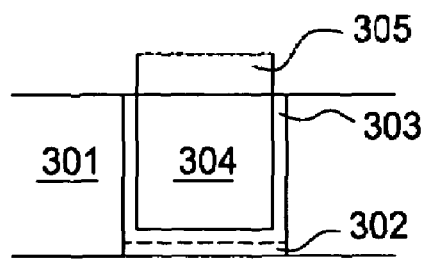
FIGS. 7A to 7B are schematic diagrams of an additional alternative embodiment of a metallized semiconductor substrate via.
Figure 7B:
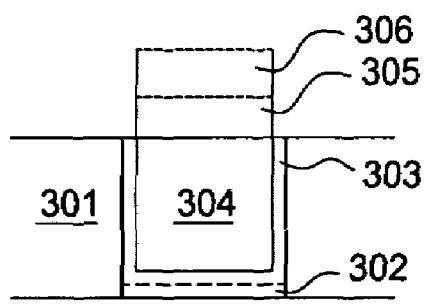

FIGS. 7A and 7B illustrate an additional embodiment utilizing a ruthenium layer in a capping layer application deposited on a metal feature such as copper. FIG. 7A illustrates a dielectric layer 301 with a ruthenium layer 302, tantalum nitride layer 303, and bulk copper fill 304 deposited in a feature formed therein. The ruthenium layer 302 is optional. The upper surface of the substrate has been chemically mechanically polished following copper deposition leaving the surface of the copper exposed. A ruthenium layer 305 is selectively deposited on the exposed copper surface. The ruthenium is preferably deposited on the exposed copper by thermal decomposition of a ruthenium containing precursor that may be combined with a carrier gas. Alternatively, ALD or CVD may be used to deposit the ruthenium. It is believed that the ruthenium layer 305 improves copper adhesion to subsequent capping layers formed thereon. The ruthenium layer 305 may act as a capping layer. Alternatively, a separate capping layer may be deposited on the ruthenium layer 305. Optionally, a chemical treatment may be used to treat the ruthenium layer 305 before an additional capping layer is deposited. Chemical treatments include exposing the substrate surface to cleaning agents, complexing agents, or other chemicals and rinsing the substrate. As one example, a material such as cobalt tungsten or cobalt tungsten phosphorous may be deposited as the additional capping layer on the ruthenium layer. FIG. 7B illustrates a capping layer 306 deposited on top of the ruthenium layer 305. The capping layer 306 may be deposited by an electroless process. In an electroless process, the substrate is exposed to a liquid containing the precursors for the capping layer. A similar ruthenium layer in combination with an additional material that acts as a capping layer is disclosed in commonly assigned U.S. patent application Ser. No. 10/965,099, entitled "Heterogeneous Activation Layers Formed by Ionic and Electroless Reactions Used for IC Interconnect Capping Layers," filed on Oct. 15, 2004, which is hereby incorporated by reference herein.

A low dielectric constant barrier layer such as a silicon carbide based layer and/or a silicon nitride layer may be deposited conformally on the ruthenium layer 305 or the capping layer 306. An example of a suitable film is a silicon carbide based film formed using the chemical vapor deposition (CVD) or plasma enhanced CVD (PECVD) processes such as the processes described in commonly owned U.S. Pat. No. 6,537,733, issued Sep. 25, 2003, U.S. patent application Ser. No. 10/196,498, filed on Jul. 15, 2002, and U.S. Pat. No. 6,790,788, issued Sep. 14, 2004, both of which are hereby incorporated by reference herein. It is believed that the ruthenium layer improves adhesion between subsequently deposited low dielectric constant film, such as a silicon and carbon containing low dielectric constant film, and capping layers. An additional dielectric deposition step may follow the silicon carbide and/or silicon nitride deposition.

Several experiments were performed to show that the transition metal layer, e.g. ruthenium, prevented agglomeration of the metal layer, e.g. copper. For each of the experiments, the dewetting of copper was measured by SEM.

First, a thin copper layer was deposited on top of an interlayer dielectric. A ruthenium layer was then deposited thereover and the stack was annealed. Specifically, 10 Å of TaN was deposited conformally over a dielectric layer with vias by sequentially flowing a tantalum containing precursor and a tantalum containing precursor in an ALD reaction. Then, 100 Å of copper was deposited using an ENCORE SIP™ chamber, which is commercially available from Applied Materials of Santa Clara, Calif. Next, a ruthenium precursor, $Ru(EtCp)_2$, was used to deposit ruthenium at varied temperatures of 40 to 420° C. at 10 Torr for 15 minutes. To confirm a reduction in. dewetting and copper agglomeration, an anneal step was performed with nitrogen at 420° C. and 15 Torr for 15 minutes. The resulting film stack was, observed using an optical microscope and/or SEM.

Figure 8:
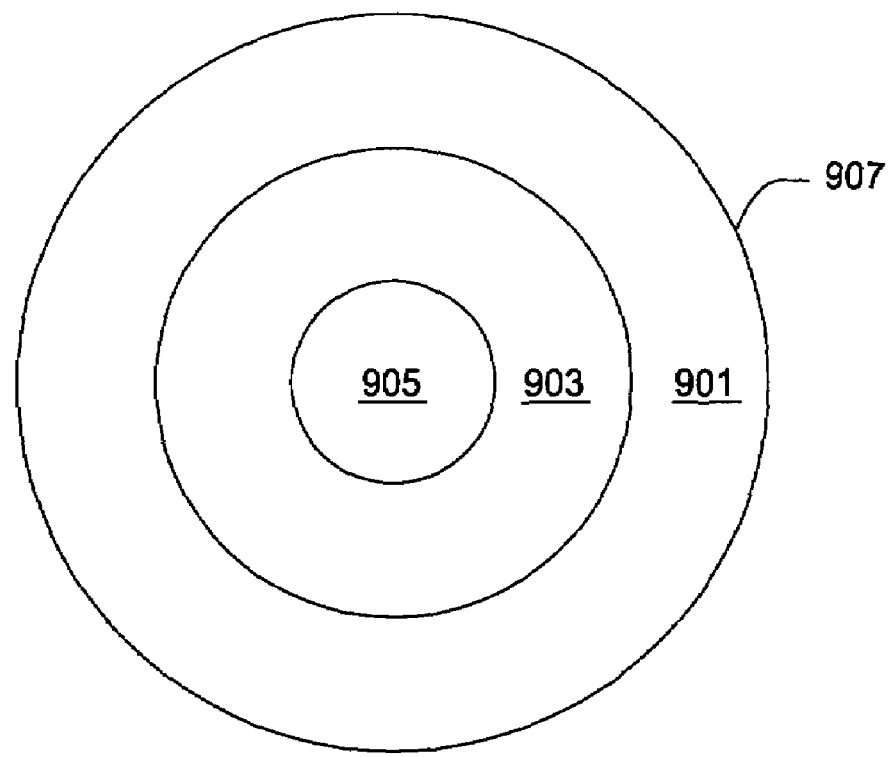
FIG. 8 is a schematic diagram of a surface of a substrate.

When the ruthenium deposition was performed between about 100° C. to about 420° C. no dewetting was observed. When the deposition was performed at 40° C., two thirds of the substrate closest to the edge 907 had no dewetting. FIG. 8 is a schematic diagram of a surface of a substrate. Region 901 and region 903 represent two thirds of the substrate closest to the edge 907 of the substrate. The middle third of the substrate, region 905, was observed to have dewetting. Thus, higher temperature ruthenium deposition is believed to decrease the likelihood of dewetting.

A second experiment was performed in which tantalum nitride and copper were deposited with identical conditions as the first experiment. The ruthenium was deposited using $Ru(EtCp)_2$ heated to 80° C. with 200 sccm argon at a chamber pressure of 1.5 Torr. The substrate heater temperature was varied between 80° C. and 275° C. and the deposition time was varied at 5, 10, 15, 60, and 900 seconds. Annealing was performed with nitrogen at 380° C. for 15 minutes. When the substrate was heated to 275° C. during the ruthenium deposition for 5 or 15 seconds, no dewetting was observed. When the substrate was heated to 80° C. for 10 seconds, the entire substrate was observed to have dewetting. When the substrate was heated to 80° C. for 60 seconds, the entire substrate except the edge had dewetting. When the substrate was heated to 80° C. for 900 seconds, dewetting was observed only on a small portion of the center of the substrate. At lower temperatures, the longer the exposure time to the ruthenium containing precursor, the lower the likelihood that dewetting occured. This also is believed to indicate that with increased exposure time, a thicker layer of ruthenium is deposited which decreases the likelihood of copper dewetting.

A third experiment was conducted in which silicon oxide and tantalum nitride were deposited with identical conditions as the first experiment. Then, 1200 Å of copper was deposited by PVD. Next, a ruthenium deposition was performed at the following conditions: a substrate support temperature of 275° C.; a a chamber pressure of 1.5 Torr; and 200 sccm argon through $Ru(EtCp)_2$ at 80° C. The deposition time was varied from 5 to 15 seconds. Additionally, 10 Å of tantalum nitride was deposited by alternating the flow of a tantalum containing precursor and a nitrogen containing precursor in an ALD process. Then, 100 Å copper was deposited by sputtering in a PVD process. Another layer of ruthenium was deposited at 275° C., a chamber pressure of 1.5 Torr, and 200 sccm argon through $Ru(EtCp)_2$ at 80° C. This structure is similar to the structure depicted in FIG. 6E. Finally, the substrate was annealed in nitrogen at 380° C. for 15 minutes. The product of the 15 second ruthenium deposition step had no copper dewetting. The product of the 5 second ruthenium deposition step had copper dewetting at the center of the substrate only; no dewetting along the edge of the substrate was observed. These results indicate that with increased exposure time, a thicker layer of ruthenium is deposited. This also may indicate that pretreating the copper with a thicker layer of ruthenium before depositing the capping layer may decrease the likelihood of copper diffusion along the copper and capping layer boundary region.

Generally, the experimental results indicate that depositing ruthenium on top of copper seed layers stabilizes and prevents dewetting of the subsequent electroplated copper over a temperature range of about 0 to about 420° C. Additional testing was performed to examine capping layer adhesion and electrochemical plating chemistry requirements when ruthenium is deposited before an additional capping layer. Ruthenium deposition performed at higher temperatures provided a faster rate of ruthenium deposition and improved capping layer adhesion compared to lower temperature deposition. Another advantage of depositing ruthenium before an additional capping layer is that electrochemical plating chemistry can be used without modification. Finally, ruthenium deposition after chemical mechanical polishing before an additional capping layer is deposited capping layer adhesion to copper. The improvement in capping layer adhesion is based on XRF measurements of films with and without a ruthenium layer. The time for deposition of ruthenium is dependent on substrate temperature, chamber pressure, flow rate of the ruthenium containing precursor, and the flow rate of carrier and diluent gases.

While the foregoing is directed to embodiments of the present invention, other and further embodiments of the invention may be devised without departing from the basic scope thereof, and the scope thereof is determined by the claims that follow.

The invention claimed is:

1. A process for forming layers on a substrate, comprising:
    depositing a copper seed layer on a substrate surface having apertures;

depositing a ruthenium metal layer over the copper seed layer, wherein the ruthenium metal layer is deposited by exposure to a ruthenium containing precursor selected from the group consisting of Ru(EtCp)$_2$, Ru(EtCp) 2,4-dimethyl pentadienyl, bis(2,4-dimethyl pentadienyl) ruthenium, and Ru(EtCp)(MeCp); and depositing a bulk metal layer over the transition metal layer.

2. The process of claim 1, wherein the ruthenium metal layer is deposited to a thickness of between about 5 to about 50 Å.

3. The process of claim 1, wherein the ruthenium metal layer is deposited by physical vapor deposition.

4. The process of claim 1, wherein the ruthenium metal layer is deposited by atomic layer deposition.

5. The process of claim 4, wherein the exposure to the ruthenium containing precursor is at a temperature in the range of about 100 to about 350° C.

6. The process of claim 1, wherein the ruthenium containing precursor is Ru(EtCp)(MeCp).

7. The process of claim 1, further comprising chemical mechanical polishing after the depositing a bulk metal layer.

8. The process of claim 7, further comprising depositing a ruthenium layer over the bulk metal layer.

9. The process of claim 1, wherein the ruthenium containing precursor is Ru(EtCp)$_2$.

10. The process of claim 1, wherein the ruthenium containing precursor is Ru(EtCp) 2,4-dimethyl pentadienyl.

11. A process for forming layers on a substrate, comprising:

forming a via through a dielectric to reveal metal at the base of the via;

depositing a copper seed layer within the via;

depositing a ruthenium metal layer within the via, wherein the ruthenium metal layer is deposited by exposure to a ruthenium containing precursor selected from the group consisting of Ru(EtCp)$_2$, Ru(EtCp) 2,4-dimethyl pentadienyl, bis(2,4-dimethyl pentadienyl) ruthenium, and Ru(EtCp)(MeCp); and depositing a first metal layer on the transition metal layer.

12. The process of claim 11, wherein the ruthenium metal layer is conformal.

13. The process of claim 12, further comprising depositing a second transition metal layer on the first metal layer.

14. The process of claim 13, wherein the first metal layer is deposited by electrochemical plating.

15. The process of claim 11, further comprising depositing a barrier layer within the via prior to the depositing a ruthenium metal layer.

16. The process of claim 15, wherein the first metal layer is deposited by electrochemical plating.

17. The process of claim 11, wherein the first metal layer is deposited by electrochemical plating.

18. The process of claim 11, wherein the ruthenium metal layer is deposited by atomic layer deposition.

19. The process of claim 11, wherein the ruthenium metal layer is deposited to a thickness of between about 5 to about 50 Å.

20. The process of claim 19, wherein the exposure to a ruthenium containing precursor is at a temperature of about 100 to about 350° C.

21. The process of claim 11, wherein the ruthenium containing precursor is Ru(EtCp)$_2$.

22. The process of claim 11, wherein the ruthenium containing precursor is Ru(EtCp)(MeCp).

23. The process of claim 11, wherein the ruthenium containing precursor is Ru(EtCp) 2,4-dimethyl pentadienyl.

24. A method of treating a metal surface, comprising:

depositing a ruthenium metal layer on an exposed metal surface, wherein the ruthenium metal layer is deposited by exposure to a ruthenium containing precursor selected from the group consisting of Ru(EtCp)$_2$, Ru(EtCp) 2,4-dimethyl pentadienyl, bis(2,4-dimethyl pentadienyl) ruthenium, and Ru(EtCp)(MeCp); and depositing a second layer thereover selected from the group consisting of a capping layer and a low dielectric constant layer.

25. The method of claim 24, wherein the second layer is a capping layer.

26. The method of claim 24, wherein the exposed metal surface comprises copper.

27. The process of claim 24, wherein the ruthenium metal layer is deposited to a thickness of between about 5 to about 50 Å.

28. The process of claim 24, wherein the ruthenium metal layer is selectively deposited on the exposed metal surface.

29. The process of claim 24, wherein the ruthenium metal layer is deposited by atomic layer deposition.

30. The process of claim 29, wherein the exposure to a ruthenium containing precursor is at a temperature of about 100 to about 350° C.

31. The process of claim 24, wherein the ruthenium containing precursor is Ru(EtCp)$_2$.

32. The process of claim 24, wherein the ruthenium containing precursor is Ru(EtCp)(MeCp).

33. The process of claim 24, wherein the ruthenium containing precursor is Ru(EtCp) 2,4-dimethyl pentadienyl.

* * * * *

UNITED STATES PATENT AND TRADEMARK OFFICE
CERTIFICATE OF CORRECTION

| | |
|---|---|
| PATENT NO. | : 7,265,048 B2 |
| APPLICATION NO. | : 11/069514 |
| DATED | : September 4, 2007 |
| INVENTOR(S) | : Hua Chung et al. |

It is certified that error appears in the above-identified patent and that said Letters Patent is hereby corrected as shown below:

Title page, In references cited, US Patent Documents, delete "2002/0000567 A1 1/2002 Kim et al" insert --2002/0000587 A1 1/2002 Kim et al--

Signed and Sealed this

Twenty-third Day of September, 2008

JON W. DUDAS
*Director of the United States Patent and Trademark Office*